(12) United States Patent
Goto et al.

(10) Patent No.: US 6,891,375 B2
(45) Date of Patent: May 10, 2005

(54) STATIC FIELD CONTROLLING METHOD AND MRI APPARATUS

(75) Inventors: Takao Goto, Tokyo (JP); Kazuya Hoshino, Tokyo (JP); Yuji Inoue, Tokyo (JP); Masaaki Sakuma, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/187,827

(22) Filed: Jul. 2, 2002

(65) Prior Publication Data

US 2003/0006771 A1 Jan. 9, 2003

(30) Foreign Application Priority Data

Jul. 4, 2001 (JP) .......................................... 2001-203874

(51) Int. Cl.[7] .................................................. G01V 3/00
(52) U.S. Cl. ......................... 324/320; 324/315; 324/319
(58) Field of Search ................................... 324/309, 315, 324/318, 319, 320

(56) References Cited

U.S. PATENT DOCUMENTS

| | | | | |
|---|---|---|---|---|
| 6,297,634 B1 | * | 10/2001 | Aoki .......................... | 324/315 |
| 6,566,880 B1 | * | 5/2003 | Kruip et al. ................. | 324/318 |
| 2003/0006771 A1 | * | 1/2003 | Goto et al. .................. | 324/309 |

FOREIGN PATENT DOCUMENTS

| EP | WO99/65392 | * 12/1999 |
|---|---|---|
| EP | WO00/16116 | * 3/2000 |

* cited by examiner

*Primary Examiner*—Diego Gutierrez
*Assistant Examiner*—Tiffany A. Fetzner
(74) *Attorney, Agent, or Firm*—Carl B. Horton, Esq.; Armstrong Teasdale LLP

(57) ABSTRACT

The temperature of permanent magnet blocks embedded in several positions in permanent magnets and base yokes will be adjusted by device of a heater to improve the static field uniformity.

6 Claims, 9 Drawing Sheets

MRI Apparatus
200

FIG. 10A1
310A
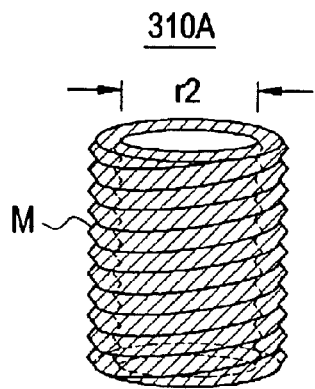
FIG. 10B1
310B
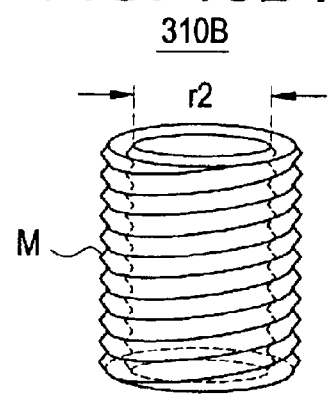
FIG. 10A2
311A
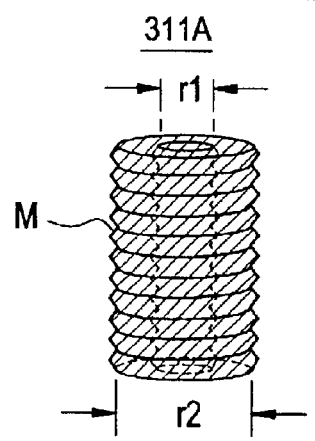
FIG. 10B2
311B
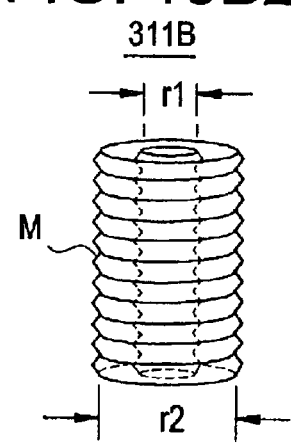
FIG. 10A3
312A
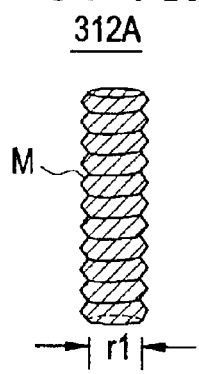
FIG. 10B3
312B
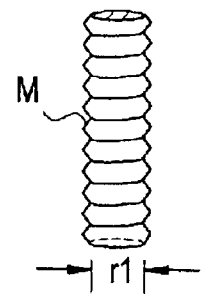

FIG. 11
| | 1 | 2 | 3 | 4 | 5 | 6 | 7 | 8 |
|---|---|---|---|---|---|---|---|---|
| Last Stage Ring | Magnetic | Magnetic | Magnetic | Magnetic | Non-Magnetic | Non-Magnetic | Non-Magnetic | Non-Magnetic |
| First Stage Ring | Magnetic | Non-Magnetic | Non-Magnetic | Non-Magnetic | Magnetic | Magnetic | Non-Magnetic | Non-Magnetic |
| Core | Magnetic | Magnetic | Magnetic | Non-Magnetic | Magnetic | Non-Magnetic | Magnetic | Non-Magnetic |
| Schematic Profile | 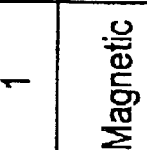 | 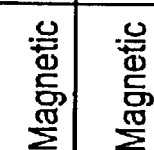 | 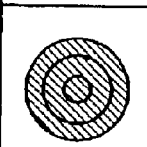 |  |  |  |  | |

STATIC FIELD CONTROLLING METHOD AND MRI APPARATUS

CROSS REFERENCE TO RELATED APPLICATIONS

This application claims the benefit of Japanese Application No. 2001-203874 filed Jul. 4, 2001.

BACKGROUND OF THE INVENTION

The present invention relates to methods for controlling static field and MRI (magnetic resonance imaging) apparatus. More specifically, the present invention relates to static field regulating methods for controlling the static field uniformity and an MRI apparatus suitably carrying out the same static field regulating methods.

FIG. 12 shows a partial cross-sectional view of a prior art MRI apparatus.

The MRI apparatus 500 is an open-type MRI apparatus which generates a static field Bo in the vertical direction.

A static field generator magnet is constituted of permanent magnets 1M1, 1M2 oppositely placed at top and bottom, a base yoke YB, columnar yokes Yp, and deflectors Sp1.

The permanent magnets 1M1 and 1M2 and the base yoke YB may incorporate screws 51 of magnetic material for static field regulation. The amount of threading of the screws 51 may enable adjusting the uniformity of the static field Bo in the imaging area KK.

In the MRI apparatus 500 as have been described above, there is first primary problem that the permanent magnets 1M1 and 1M2 and base yoke YB and deflector Sp1 may be susceptible to change in temperature, after the amount of threading of the screws 51 has been adjusted. For example, when using Nd—Fe—B material for the permanent magnets 1M1 and 1M2, which material has its temperature characteristics of approximately $-0.1\% /°C.$, if the temperature of either one of the permanent magnets 1M1 and 1M2 is raised from the temperature of the other magnet after the amount of threading of the screws 51 has been adjusted, then some static field inconsistency of the significant size will occur in the static field direction (direction of Z-axis), which is not neglectable, however the system cannot address it.

Also, in such a system as the MRI apparatus 500 that may adjust the amount of threading of the screws 51, there may be second major problem that either the adjustable range or the adjusting accuracy of the uniformity of the static field Bo will be traded off. For example, if the permeability of the screws 51 is enough larger, then the adjustable range will be wider while on the other hand the adjustment accuracy will become coarse. Contrarily if the magnetic permeability is enough smaller then the adjustment accuracy will be finer while on the other hand the adjustment range will be narrowed.

SUMMARY OF THE INVENTION

Accordingly, an object of the present invention is to provide a static field regulation method for controlling the uniformity of the static field and an MRI apparatus suitable carrying out the static field regulation method. More specifically, an object of the present invention is to provide a static field regulation method and an MRI apparatus tolerant to change in temperature in the permanent magnets, yokes, and deflectors. Another object of the present invention is to provide a static field regulation method and an MRI apparatus, which may not sacrifice either adjustable range or accuracy for regulating the uniformity of the static field.

In the first aspect, the present invention provides a static field regulation method for controlling the static field uniformity by adjusting the local temperature of at least one of the permanent magnets, yokes, and deflectors used in the static field generator magnet.

In the static field regulation method in accordance with the first aspect of the present invention, the local temperature of at least one of the permanent magnets, yokes, and deflectors used in the static field generator magnet will be actively regulated. Thus by taking advantages of the larger temperature characteristics of the permanent magnets, the static field uniformity can be controlled. Also, the regulation of local temperature may prevent unintended temperature change, to thereby increase the tolerance to the temperature change.

In the second aspect, the present invention provides an MRI apparatus comprising a temperature regulator means for adjusting local temperature of at least one of the permanent magnets, yokes, and deflectors used in the static field generator magnet, characterized by adjusting the local temperature so as to regulate the static field uniformity.

In the MRI apparatus in accordance with the second aspect of the present invention, the local temperature of at least one of the permanent magnets, yokes, and deflectors used in the static field generator magnet will be actively regulated. Thus by taking advantages of the larger temperature characteristics of the permanent magnets, the static field uniformity can be controlled. Also, the regulation of local temperature may prevent unintended temperature change, allowing preventing the disturbance of the static field uniformity caused by the temperature change.

In the third aspect, the present invention provides an MRI apparatus arranged as set forth in the foregoing description, in which the temperature regulator means comprises a temperature sensor for detecting the local temperature; at least one of a heater for raising the local temperature and a cooler for decreasing the local temperature; a controller means for controlling the operation of the heater and the cooler such that the local temperature will be held at a preset temperature.

In the MRI apparatus in accordance with the third aspect of the present invention, the local temperature will be regulated by feed back control so as to prevent unintended temperature change, allowing preventing the disturbance of the static field uniformity caused by the temperature change.

In the fourth aspect, the present invention provides an MRI apparatus arranged as set forth in the foregoing description, in which a permanent magnet block having the temperature sensor and at least one of the heater and the cooler mounted on a permanent magnet member, is mounted on at least one of the permanent magnets, the yoke, and the deflectors.

In the MRI apparatus in accordance with the fourth aspect of the present invention, the regulation may be controlled on the basis of permanent magnet block, allowing facilitating the installation and the maintenance. In addition, the use of permanent magnet members may allow enlarging the adjustable range.

In the fifth aspect, the present invention provides an MRI apparatus arrange as set forth in the foregoing description, in which a permanent magnet block having the temperature sensor and at least one of the heater and the cooler mounted on a magnetic member, is mounted on at least one of the permanent magnets, the yoke, and the deflectors.

In the MRI apparatus in accordance with the fifth aspect of the present invention, the regulation may be controlled on the basis of magnetic material blocks, allowing facilitating the installation and the maintenance. In addition, the use of permanent magnet members that generates no magnetic force also may facilitate the maintenance.

In the sixth aspect, the present invention provides an MRI apparatus set forth in the foregoing description, in which a heat insulator is interposed between the permanent magnet block or the magnetic block and other components adjacent thereto.

In the MRI apparatus in accordance with the sixth aspect of the present invention, the permanent magnet blocks or magnetic material blocks may be thermally isolated from the environment so as to have less thermal inertia to get faster responses to the adjustment.

In the seventh aspect, the present invention provides an MRI apparatus set forth in the foregoing description, in which the permanent magnet block or the magnetic block is placed in a position so as to allow controlling the static field uniformity of the static field orientation.

In the MRI apparatus in accordance with the seventh aspect of the present invention, a pair of permanent magnet blocks or magnetic material blocks may be placed for example on both permanent magnets in opposite locations on the axis of the static field direction (Z-axis) passing through the center of imaging area to allow adjusting the static field uniformity of the static field direction.

In the eighth aspect, the present invention provides an MRI apparatus set forth in the foregoing description, in which the permanent magnet block or the magnetic block may be placed in a position so as to allow controlling the static field uniformity in a direction perpendicular to the direction of static field.

In the MRI apparatus in accordance with the eighth aspect of the present invention, a pair of permanent magnet blocks or magnetic material blocks may be placed on a surface of one permanent magnet and on the axis (X- and Y-axis) perpendicular to the axis of the static field direction (Z-axis) passing through the center of the imaging area so as to allow adjusting the static field uniformity in the direction perpendicular to the static field direction.

In the ninth aspect, the present invention provides a method for controlling static field, comprising the steps of:

providing a mounting means for mounting static field controller unit on at least one of a permanent magnet, yoke and deflector for static field generator magnet; and mounting to the means for mounting static field controller unit a static field regulator unit selected from a group including a plurality of static field regulator units each having a different magnetic resistance value and being detachable from the static field regulator unit mounting means so as to control the static field uniformity.

In the method in accordance with the ninth aspect of the present invention, the static field regulation unit to be attached to at least one of the permanent magnets, yokes and deflectors may be interchanged with another one having a different magnetic resistance value. This allows adjusting the static field uniformity. In addition, since the units are to be replaced in the entire system, the adjustable range will be widen if the units are replaced with the ones each having a magnetic resistance value enough different, and the adjustable accuracy will be finer if the units are replaced with the ones each having a magnetic resistance value less different each from another.

In the tenth aspect, the present invention provides an MRI apparatus, comprising a mounting means for mounting static field regulator unit which is provided on at least one of a permanent magnet, yoke and deflector for static field generator magnet, and a static field regulator unit selected from a group including a plurality of static field regulator units each having a different magnetic resistance value and being detachable from the static field regulator unit mounting means, the unit being mounted to the mounting means for mounting static field regulator unit so as for the static field uniformity to be controlled.

In the MRI apparatus in accordance with the tenth aspect of the present invention, the static field regulation unit to be attached to at least one of the permanent magnets, yokes and deflectors may be interchanged with another one having a different magnetic resistance value. This allows adjusting the static field uniformity. In addition, since the static field regulator units are to be replaced in the entire system, the adjustable range will be widen if the units are replaced with the ones each having a magnetic resistance value enough different, and the adjustable accuracy will be finer if the units are replaced with the ones each having a magnetic resistance value less different each from another.

In the eleventh aspect, the present invention provides an MRI apparatus set forth in the foregoing description, in which the static field regulator unit mounting means is a screw hole, the outer shape of the static field regulator unit being a form of screw to be threaded into the screw hole.

In the MRI apparatus in accordance with the eleventh aspect of the present invention, the static field regulation units may be detachable by threading so as to facilitate the replacement.

In the twelfth aspect, the present invention provides an MRI apparatus set forth in the foregoing description, further comprising the plurality of static field regulator units including a first static field regulator unit assembly integrating first solid cylinder having a different outer diameter from the first solid cylinder with a first hollow cylinder having a the same outer diameter as the first hollow cylinder and surrounding around and supporting the first solid cylinder, one of the first solid cylinder and the first hollow cylinder being of magnetic material and the other being of nonmagnetic material; and a second static field regulator unit assembly integrating second solid cylinder with second hollow cylinder surrounding around and supporting the second solid cylinder, one of the second solid cylinder and the second hollow cylinder being of magnetic material and the other being of nonmagnetic material.

In the MRI apparatus in accordance with the twelfth aspect of the present invention, the magnetic resistance value may be changed as desired by changing the outer diameter of the solid cylinder component.

In the thirteenth aspect, the present invention provides an MRI apparatus set forth in the foregoing description, in which the plurality of static field regulator units further comprising a static field regulator unit in a form of solid cylinder made of magnetic material to be threaded into the screw hole.

In the MRI apparatus in accordance with the thirteenth aspect of the present invention, the magnetic resistance value may be changed as desired by changing the material of the magnetic material.

In the fourteenth aspect, the present invention provides an MRI apparatus set forth in the foregoing description, in which the plurality of static field regulator units further comprising a static field regulator unit assembly, which is integrally assembled of: a solid cylinder in a form of threading screw; a first stage hollow cylinder in an outer shape of threaded screw having as a center bore a screw hole for threading the solid cylinder therein; and a last stage hollow cylinder in an outer shape of threaded screw having as a center bore a screw hole for threading the fist stage hollow cylinder so as to be inserted into the screw hole of the static field regulator unit mounting means; and the units having a magnetic resistance value adjustable by using the combination of the solid cylinder and the first stage hollow cylinder and the last stage hollow cylinder of either magnetic or nonmagnetic material respectively.

In the MRI apparatus in accordance with the fourteenth aspect of the present invention, the magnetic resistance value may be changed as desired by changing the material of the solid cylinder and first stage hollow cylinder and last stage hollow cylinder.

In the fifteenth aspect, the present invention provides an MRI apparatus set forth in the foregoing description, in which: the static field regulator unit mounting means is placed in positions where the static field uniformity in the static field direction is adjustably controlled.

In the MRI apparatus in accordance with the fifteenth aspect of the present invention, the static field uniformity in the static field direction may be adjustable by installing for example a pair of static field regulation units on both permanent magnets of the opposite location and on the axis along with the static field direction (Z-axis) passing through the center of the imaging area.

In the sixteenth aspect, the present invention provides an MRI apparatus set forth in the foregoing description, in which the static field regulator unit mounting means is placed in positions so as for the static field uniformity in the direction perpendicular to the static field direction to be adjustably controlled.

In the MRI apparatus in accordance with the sixteenth aspect of the present invention, the static field uniformity in the direction perpendicular to the static field direction may be adjustable by installing a pair of static field regulation units on the axis (X- and Y-axis) perpendicular to the axis in the static field direction (Z-axis) passing through the center of the imaging area and on a surface of one permanent magnet.

In accordance with the static field regulation method and MRI apparatus of the present invention, static field uniformity may be regulated. The present invention may prevent the disturbance of static field caused by the temperature fluctuation. Furthermore, the static field uniformity may be regulated without sacrificing either one of adjustable range or adjustment accuracy.

Further objects and advantages of the present invention will be apparent from the following description of the preferred embodiments of the invention as illustrated in the accompanying drawings.

BRIEF DESCRIPTION OF THE DRAWINGS

FIG. 10 is a schematic diagram of components forming the static field regulation unit of FIG. 9.

FIG. 11 is a table indicating the combinations of structural pattern of the static field regulation unit of FIG. 9.

DETAILED DESCRIPTION OF THE INVENTION

A detailed description of one preferred embodiment embodying the present invention will now be given referring to the accompanying drawings.

[First Embodiment]

Figure 1:
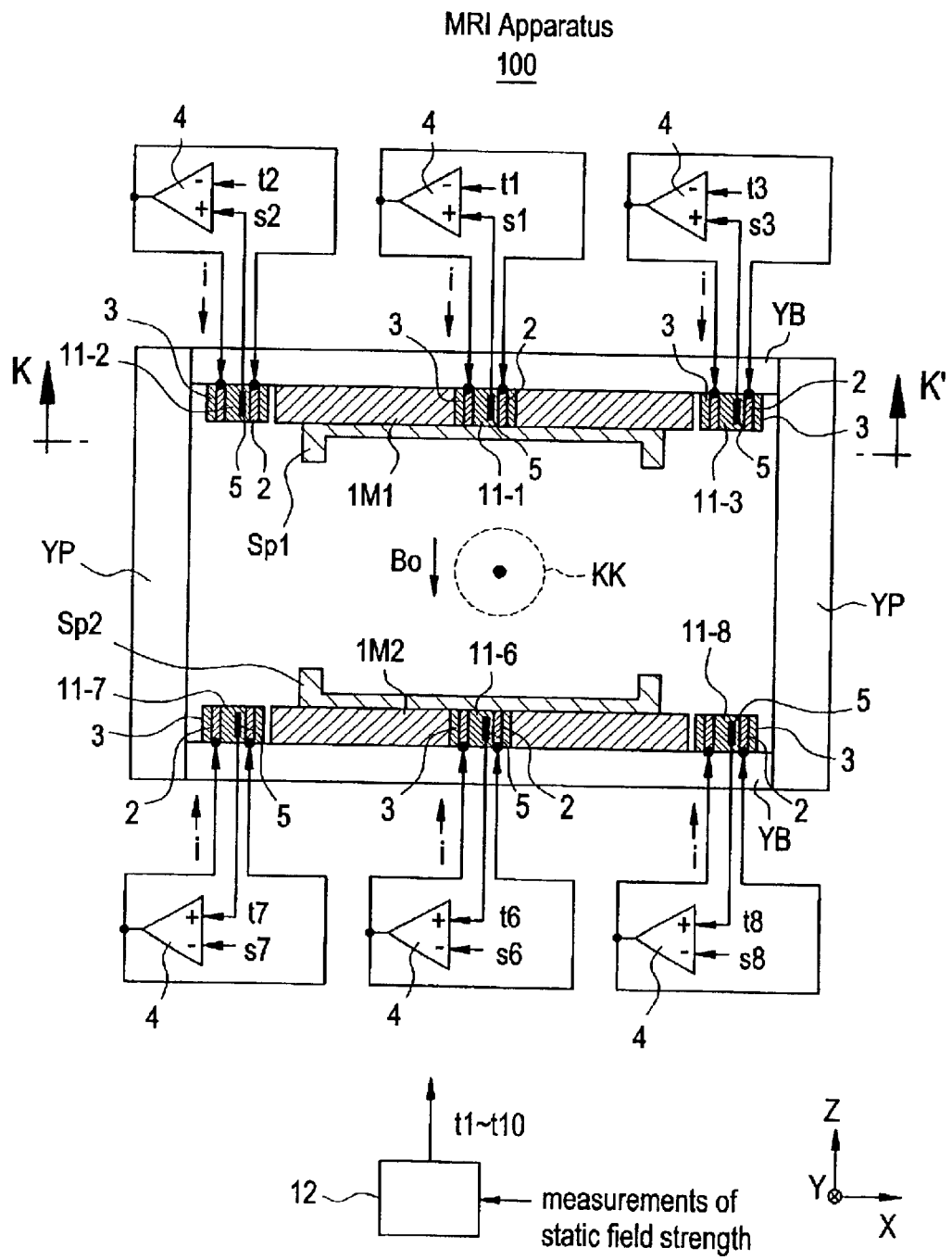
FIG. 1 is a partial cross-sectional view of an MRI apparatus in accordance with first preferred embodiment of the present invention.
Figure 2:
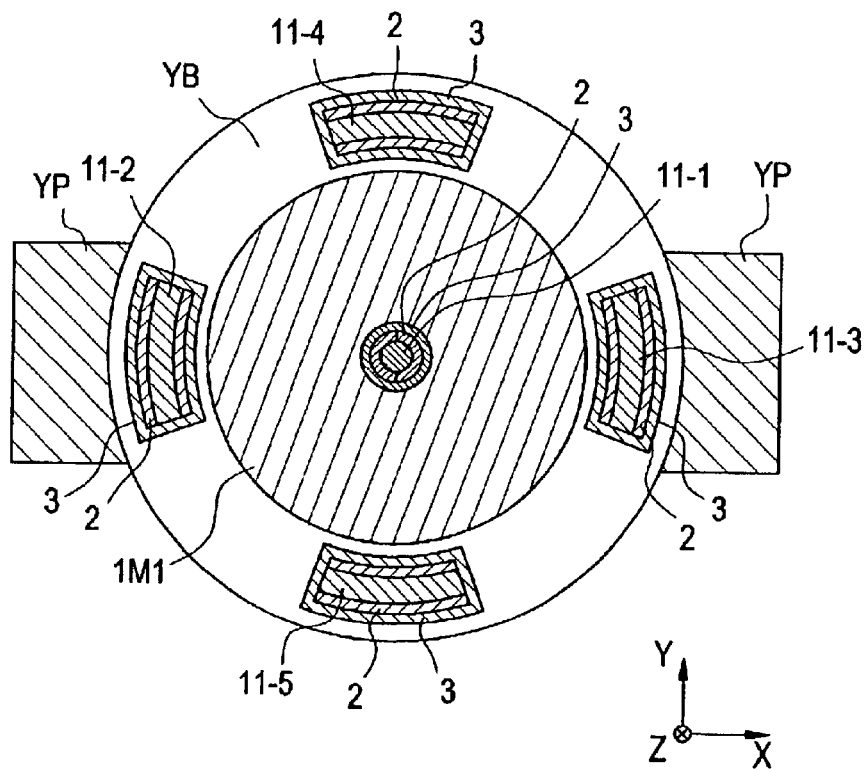
FIG. 2 is a cross-sectional view taken along with the line K–K' of FIG. 1.

Now referring to FIG. 1, which shows a partial cross-sectional view of an MRI apparatus in accordance with first preferred embodiment of the present invention. Also referring to FIG. 2, which shows a cross-sectional view taken along with the line K–K' of FIG. 1.

The MRI apparatus 100 is an open-type MRI apparatus, which generates static field Bo in the vertical direction from the permanent magnets, namely the permanent magnets 1M1 and 1M2 mounted on top and bottom at opposite locations.

On the surface of the respective permanent magnets 1M1 and 1M2 deflector Sp1 and Sp2 are mounted which may improve the uniformity of the static field Bo in the imaging area KK.

A magnetic circuitry may be formed by the permanent magnets 1M1 and 1M2, the deflector Sp1 and Sp2, base yokes YB, and columnar yokes Yp. The material used for the permanent magnets 1M1 and 1M2 may include, for example Neodymium magnetic materials (Nd—Fe—B), Samarium-Cobalt magnetic materials (Sm—Co), Al—Ni—Co magnetic materials (MK steels), and ferrite magnetic materials.

Permanent magnet blocks 11-1 through 11-5 are embedded or attached to some parts of the permanent magnet 1M1 and base yoke YB, for regulating temperature locally.

Permanent magnet blocks 11-6 through 11-10 are embedded or attached to some parts of the permanent magnet 1M2 and base yoke YB, for regulating temperature locally.

The permanent magnet block 11 has a heater 2 incorporated for raising the temperature of the block. In addition, the permanent magnet block 11 may be thermally isolated by means of the insulator 3 from any other components.

The current i flowing through the heater 2 will be controlled by the temperature regulator unit 4, such that the temperature s of the permanent magnet block 11 measured by the temperature sensor 5 will become equal to the temperature t preset in the temperature configuration unit 12.

The temperature configuration unit 12 will set the temperature set s1 to s10 for use in generation of compensation field for equalizing the static field Bo by each permanent magnet block 11.

It should be noted that there may be cases in which a heater may be provided for adjusting the system temperature on the base yoke YB, the aforementioned heater 2 will have to be provided separately.

Figure 3:
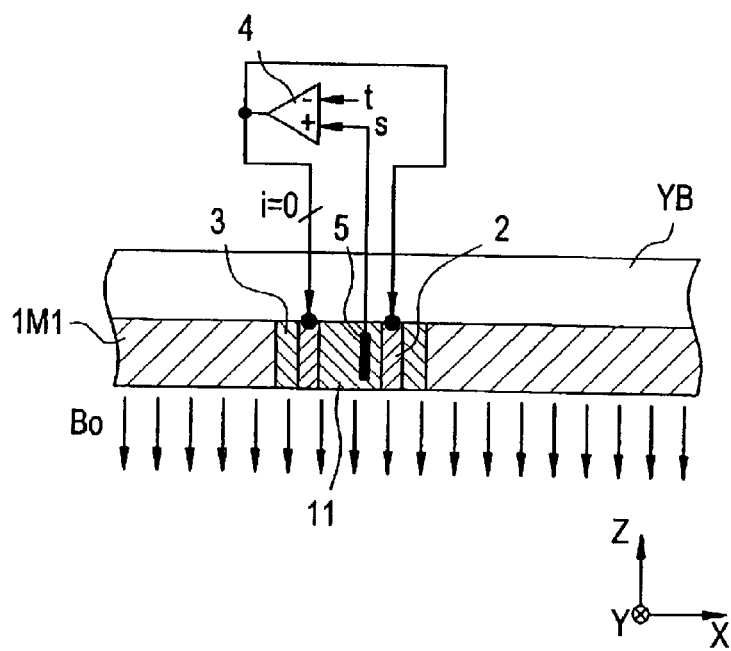
FIG. 3 is a schematic diagram of the distribution of magnetic field when the permanent magnet block is at the ambient temperature.

Now referring to FIG. 3, when the current i does not flow through the heater 2 by the temperature regulator unit 4 so that the permanent magnet block 11 is at the temperature of environment, the permanent magnet block 11 may generate a field of the strength corresponding to the ambient temperature.

Figure 4:
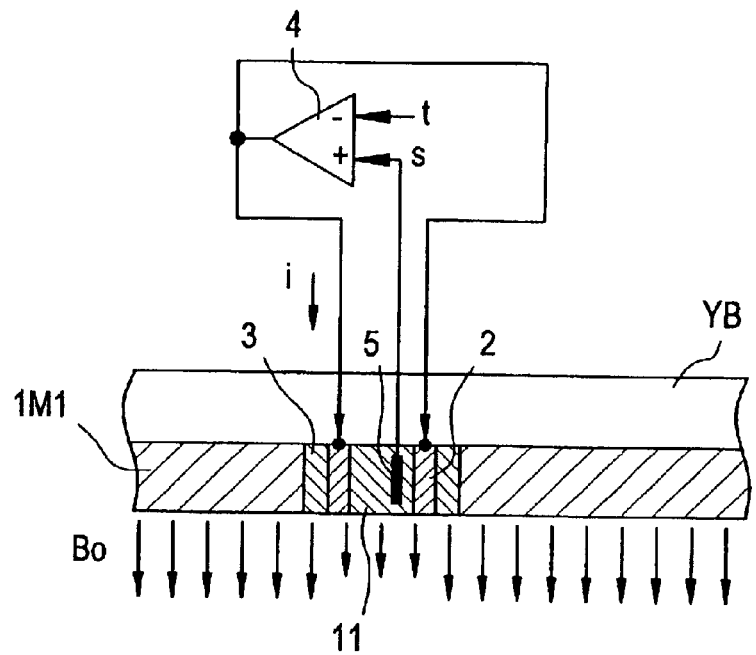
FIG. 4 is a schematic diagram of the distribution of magnetic field when the temperature of permanent magnet block is raised.

Now referring to FIG. 4, when the current i flows through the heater 2 by the temperature regulator unit 4 to raise the temperature of the permanent magnet block 11, the magnetic force generated by the permanent magnet block 11 will be weaken. This is because the permanent magnet block 11 has its temperature characteristics of negativeness.

Figure 5:
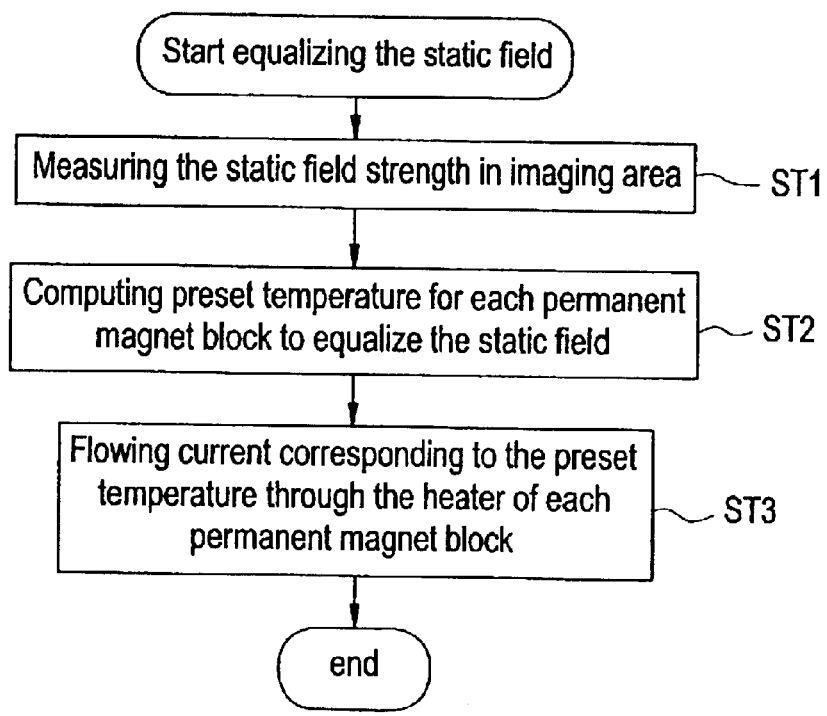
FIG. 5 is a flow diagram indicating the equalization of static field in the MRI apparatus shown in FIG. 1.

Now referring to FIG. 5, there is shown a flow diagram indicating the equalization of static field in the MRI apparatus 100. In step ST1, the static field strength at the imaging area KK will be measured by such an instrument as a tesla meter to send to the temperature configuration unit 12, without a subject inserted.

In step ST2, the temperature configuration unit 12 will compute the preset temperature t for the permanent magnet block 11 in order to equalize the static field Bo, based on the measurements of static field strength and the known temperature characteristics.

For instance, in order to enforce the field of positive side in the X-axis direction when compared to the negative side field in the X-axis direction, the temperature will be increased locally at the permanent magnet block 11-2 only, and the temperature will be maintained at the permanent magnet block 11-3 (the same procedure will be applied to the permanent magnet 1M2 side).

In order to enforce the field of positive side in the Y-axis direction when compared to the negative side field in the Y-axis direction, the temperature at only the permanent magnet block 11-5 will be raised locally and the temperature will be maintained at the permanent magnet block 11-4.

In order to enforce the field of upper side in the Z-axis direction when compared to the lower side field in the Z-axis direction, the temperature at only the permanent magnet block 11-6 will be raised locally and the temperature will be maintained at the permanent magnet block 11-1.

The compensation available by altering the temperature of permanent magnet block 11 is the first order nominal of the magnetic field gradient in each of X-, Y-, and Z-axis (approximately 60 to 70 ppm of compensation will be available with the temperature difference of 1° C.). In addition, somewhat compensation for the second order nominal of the field gradient in the Z-axis direction may be achieved by adjusting so as to for example increase or decrease simultaneously the permanent magnet blocks 11-1 and 11-6 (approximately 3 to 6 ppm of compensation will be available with the temperature difference of 1° C.).

In step ST3, the temperature regulator unit 4 will control the current flow i through the heater 2 so as for the temperature s of the permanent magnet block 11 to become equal to the preset temperature t.

In accordance with the MRI apparatus 100 as have been described above, the uniformity of static field Bo may be regulated by adjusting independently the temperature of respective permanent magnet block 11. The adjustment of local temperature allows preventing unintended change of temperature, as well as preventing disturbance of static field uniformity caused by the temperature fluctuation.

The first preferred embodiment described above may be modified as follows:

(1) instead of or in addition to adjusting local temperature of the permanent magnet 1M1 or the base yoke YB, the temperature of deflector Sp1 and Sp2 may be locally adjusted.

(2) in lieu of use of the heater 2, any other heating/cooling device such as a Peltier device may be used to adjust the temperature of the permanent magnet block 11. Alternatively, a heater 2 and a cooler device may be used together.

(3) in lieu of use of the permanent magnet block 11 made from permanent magnet member (magnetized magnetic material), a magnetic material block made from any unmagnetized magnetic material may be used.

[Second Embodiment]

Figure 6:
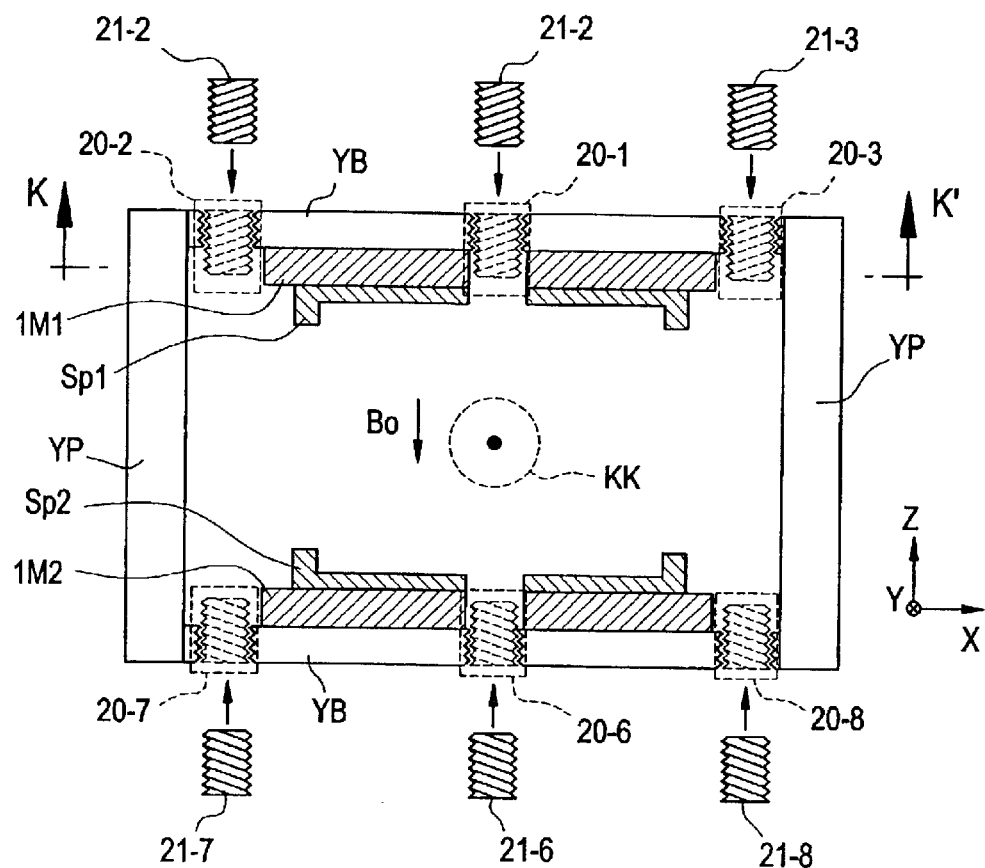
FIG. 6 is a partially cross-sectional view of an MRI apparatus in accordance with second preferred embodiment of the present invention.
Figure 7:
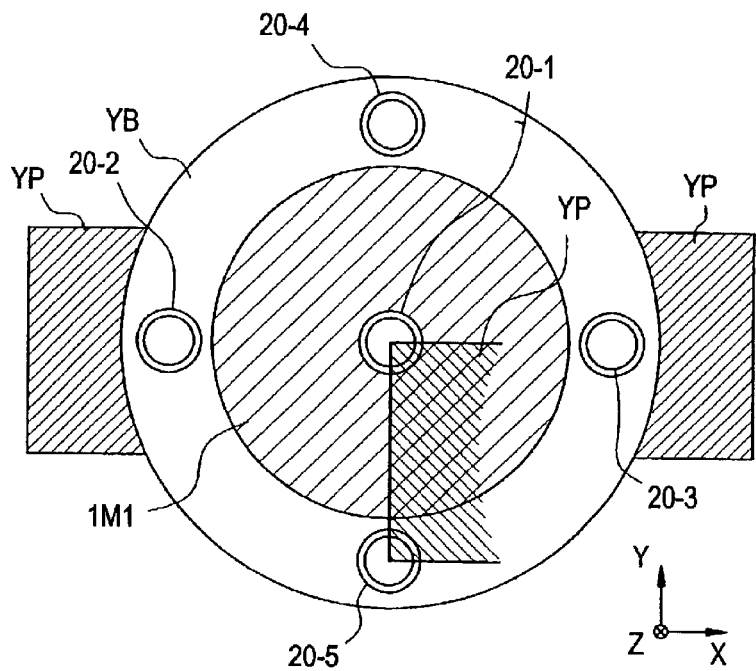
FIG. 7 shows a cross-section taken along with the line K–K' of FIG. 6.

Now referring to FIG. 6, there is shown a partially cross-sectional view of an MRI apparatus in accordance with second preferred embodiment of the present invention. Also referring to FIG. 7, which shows a cross-section taken along with the line K–K' of FIG. 6.

In this MRI apparatus 200, the permanent magnet 1M1 and base yoke YB may have at many positions a screw hole opened, namely static field regulation unit mounting means 20-1 to 20-10, which optionally attach and detach a static field regulation unit 21-1 to 21-10 selected from a group constituted of a plurality of types of units (21α, 21β, 21γ shown in FIG. 8).

Figure 8A:
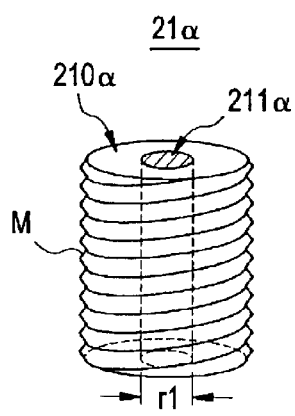
FIG. 8 is a schematic diagram indicating static field regulation units for use in the MRI apparatus of FIG. 6.

As shown in FIG. 8(a), the static field regulation unit 21α may be formed from a nonmagnetic socket 210α as a hollow cylinder element and in the outer shape of a threaded screw, and a magnetic core 211α extending through the center of the socket and in the form of solid cylinder of diameter r1.

Figure 8B:
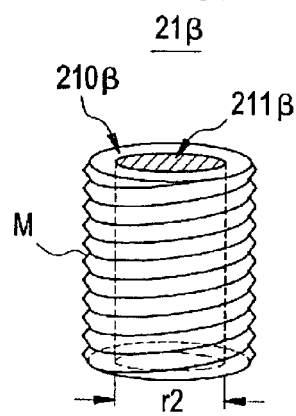

As shown in FIG. 8(b), static field regulation unit 21β may be formed of a nonmagnetic socket 210β, and a magnetic core 211β extending through the center of the socket and having its diameter of r2 (where r2>r1).

Figure 8C:
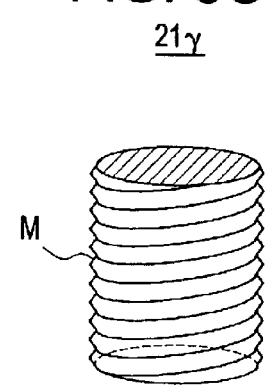

As shown in FIG. 8(c), the static field regulation unit 21γ may be a solid cylinder, which is entirely of magnetic material.

The outer periphery of respective static field regulation unit 21 α, 21β, and 21γ, has each thread kerf M cut to insert into the static field regulation unit mounting means 20.

The nonmagnetic material used for the nonmagnetic socket 210α and 210 β may be one of, or a combination of two or more of PP (Polypropylene), PBT (Polybutylene Terephthalate), ABS (Acrylonitrile Butadiene Styrene), PEG (Polyethylene), PS (Polystyrene), TPX (Polymethylpentene), POM (Polyacetals), PVC (Polyvinyl Chloride), and PPE (Polyphenylene Ether).

The magnetic material used for the magnetic cores 211α, 211β and static field regulation unit 21γ may be one of, or a combination of two or more of neodymium magnetite, samarium cobalt, Al—Ni—Co, and ferrite magnetic materials.

In this MRI apparatus 200, one static field regulation unit 21 (either one of 21α, 21β, or 21γ shown in FIG. 8) selected so as to achieve the best improvement of the uniformity of static field Bo in the imaging area KK will be attached to the static field regulation unit mounting means 20.

In accordance with the MRI apparatus 200 described above, the uniformity of static field Bo may be regulated by interchanging the static field regulation unit 21 mounted on the static field regulation unit mounting means 20. Since all units are to be replaced, the adjustable range will be widen when replacing with the units having a larger difference of the magnetic resistance value, and the adjustment accuracy will be refined when replacing with the units having a smaller difference of the magnetic resistance value.

In FIG. 8, although there are shown three types of static field regulation units 21α, 21β, and 21γ, a more wider range of static field regulation units may be used each having a different magnetic resistance value. Also, the nonmagnetic socket can be alternatively a magnetic socket, and the magnetic core can be alternatively a nonmagnetic core.

[Third Embodiment]

Figure 9:
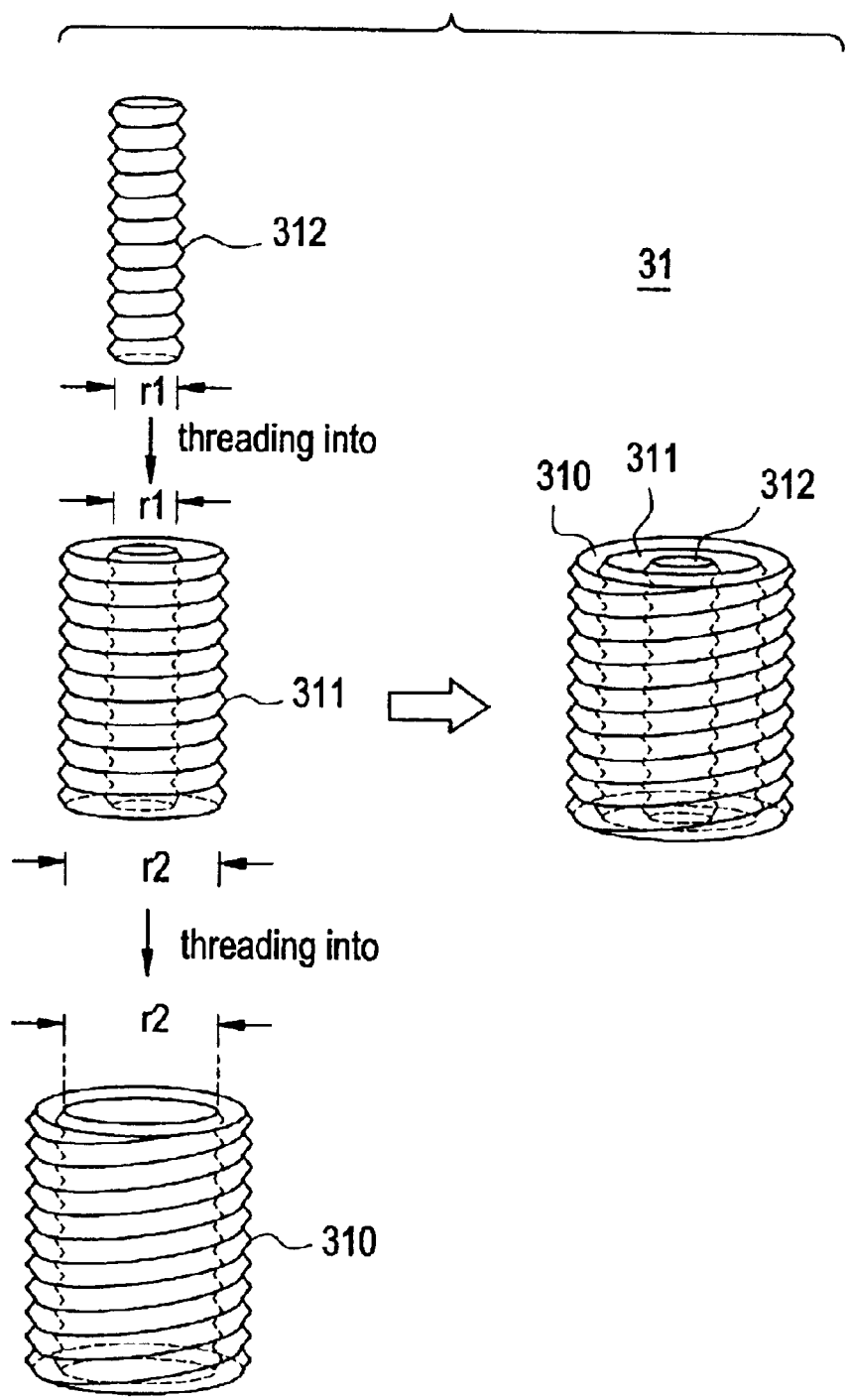
FIG. 9 is a schematic diagram of the static field regulation unit of the MRI apparatus in accordance with third preferred embodiment.
Figure 12:
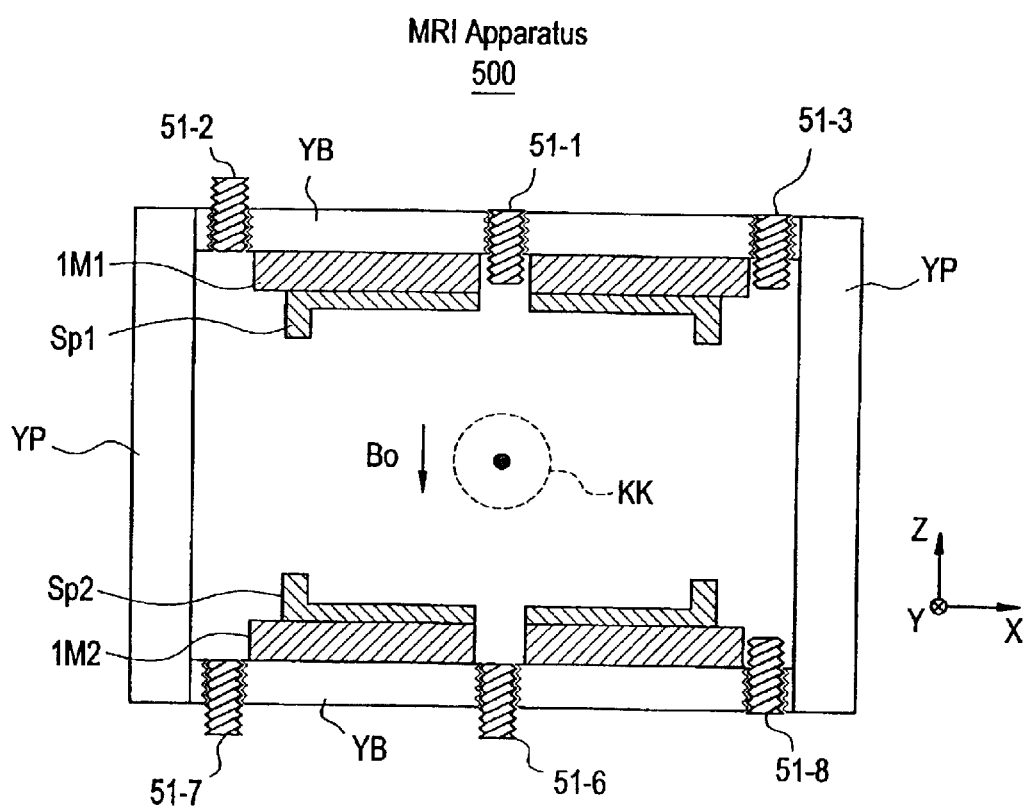
FIG. 12 is a partial cross-sectional view of a prior art MRI apparatus.

An MRI apparatus in accordance with the third preferred embodiment of the present invention uses a static field regulation unit 31 as shown in FIG. 9, instead of the static field regulation unit 21 (see FIG. 8) used in the above second preferred embodiment. More specifically, a static field regulation unit 31 assembly will be used, which is assembled by a last stage ring 310 in the form of hollow cylinder having threaded into the center bore a first stage ring 311 in the form of hollow cylinder having threaded into the center bore a core 312 in the form of solid cylinder.

As shown in FIG. 10(*a*1) and (*b*1), either one of last stage ring 310A of magnetic material or last stage ring 310B of nonmagnetic material will be selected for the last stage ring 310.

As shown in FIG. 10(*a*2) and (*b*2), either one of first stage ring 311A of magnetic material or first stage ring 311B of nonmagnetic material will be selected for the first stage ring 311.

As shown in FIG. 10(*a*3) and (*b*3), either one of core 312A of magnetic material or core 312B of nonmagnetic material will be selected for the core 312.

Accordingly, as shown in FIG. 11, there will be eight combinational structure patterns of the static field regulation unit 31. In the profile diagram the magnetic material is indicated as hatched.

In this MRI apparatus, a static field regulation unit 31 having one of structural pattern (any one of 8 patterns shown in FIG. 8) selected for the best improvement of the uniformity of static field Bo in the imaging area KK (see FIG. 6) will be mounted to the static field regulation unit mounting means 20.

In accordance with the above MRI apparatus, the uniformity of static field Bo may be adjusted by interchanging the static field regulation unit 31 to be mounted in the static field regulation unit mounting means 20. Also, since all units are to be replaced, the adjustable range will be widen when replacing with the units having a larger difference of the magnetic resistance value, and the adjustment accuracy will be refined when replacing with the units having a smaller difference of the magnetic resistance value.

A variety of static field regulation units each having a different magnetic resistance value may be available by changing the diameter and length of the first stage ring and core, and the material of the last stage and first stage rings and the core.

By interposing another insertion ring between the first stage ring and the last stage ring to increase the number of stages, the number of structure patterns may be further increased.

Many widely different embodiments of the invention may be configured without departing from the spirit and the scope of the present invention. It should be understood that the present invention is not limited to the specific embodiments described in the specification, except as defined in the appended claims.

What is claimed is:

1. An MRI apparatus, comprising:

a temperature regulator device configured to adjust local temperature of at least one of permanent generating magnets, yoke, and deflectors of a static field generator magnet, wherein said static field generator magnet generates a static magnetic field and said temperature regulator device is configured to adjust said local temperature of the at least one of said permanent generating magnets, yoke, and deflectors to control uniformity of the static magnetic field; and a separate block of permanent magnetic material including at least one of a heater configured to increase said local temperature and a cooler configured to decrease said local temperature, wherein said separate block of permanent magnetic material is embedded within at least one of said permanent generating magnets, yoke, and deflectors, said separate block of permanent magnetic material is different from at least one of said permanent generating magnets, yoke, deflectors, heater and cooler, and at least one of said heater and cooler are configured to be controlled by said temperature regulator device.

2. The MRI apparatus set forth in claim 1, wherein said temperature regulator device comprises: a controller device configured to control an operation of said heater and said cooler such that said local temperature will be held at a preset temperature.

3. The MRI apparatus set forth in claim 1, wherein said permanent magnetic material is one of a magnetized material and an unmagnetized material.

4. The MRI apparatus set forth in claim 1, wherein a heat insulator is interposed between said separate block of permanent magnetic material and other components adjacent thereto.

5. The MRI apparatus set forth in claim 1, wherein said separate block of permanent magnetic material is placed in a position so as to allow controlling the uniformity of the static magnetic field.

6. The MRI apparatus set forth in claim 1, wherein said separate block of permanent magnetic material is placed in a position so as to allow controlling the uniformity of the static magnetic field in a direction perpendicular to a direction of the static magnetic field.

* * * * *